United States Patent
DeCoux (10) Patent No.: US 10,816,703 B2
(45) Date of Patent: Oct. 27, 2020

(54) NEAR INFRARED REFLECTIVE COATINGS

(71) Applicant: Tru Vue, Inc., Faribault, MN (US)

(72) Inventor: James C. DeCoux, Faribault, MN (US)

(73) Assignee: Tru Vue, Inc., Fairbault, MN (US)

( * ) Notice: Subject to any disclaimer, the term of this patent is extended or adjusted under 35 U.S.C. 154(b) by 0 days.

(21) Appl. No.: 15/278,611

(22) Filed: Sep. 28, 2016

(65) Prior Publication Data

US 2017/0090078 A1 Mar. 30, 2017

Related U.S. Application Data

(60) Provisional application No. 62/233,644, filed on Sep. 28, 2015.

(51) Int. Cl.
*F21V 9/04* (2018.01)
*F21V 9/06* (2018.01)
(Continued)

(52) U.S. Cl.
CPC ........ *G02B 5/0833* (2013.01); *C03C 17/3417* (2013.01); *C09D 1/00* (2013.01);
(Continued)

(58) Field of Classification Search
CPC ... C23C 14/022; C23C 14/048; C23C 14/083; C23C 14/086; C23C 14/10; C23C 14/28; C23C 14/35; C03C 17/36; C03C 17/361; C03C 17/3602; C03C 17/3605; C03C 17/3417; C03C 17/3423; C03C 17/3692; C09D 1/00; C09D 5/004; G02B 5/0833; G02B 5/0891; H01S 5/0207;
(Continued)

(56) References Cited

U.S. PATENT DOCUMENTS 4,900,633 A 2/1990 Gillery
4,902,081 A 2/1990 Huffer et al.
(Continued)

FOREIGN PATENT DOCUMENTS

EP 0622645 A1 11/1994
EP 0632507 A2 1/1995
(Continued)

OTHER PUBLICATIONS

International Search Report for International Patent Application No. PCT/US2016/054134, dated Nov. 20, 2016 (7 pages).
(Continued)

*Primary Examiner* — Mustak Choudhury
(74) *Attorney, Agent, or Firm* — Dorsey & Whitney LLP (57) ABSTRACT

A coating composition comprising 6 to 20 alternating layers of $SiO_2$ and one of $ZrO_2$ or $Nb_2O_5$ wherein the thickness of each individual layer is about 70 nm to 200 nm is described. Also described is a substrate comprising a coating on at least a first major side thereof, the coating comprising 6 to 20 alternating layers of $SiO_2$ and one of $ZrO_2$ or $Nb_2O_5$ wherein the thickness of each individual layer is about 70 nm to 200 nm. The substrate can be glass, plastic, or metal. Also disclosed herein are methods of making the coated substrate. The coatings have good optical transparency and NIR reflectivity.

15 Claims, 7 Drawing Sheets

(51) Int. Cl.
| | |
|---|---|
| G02B 5/08 | (2006.01) |
| G02B 5/20 | (2006.01) |
| C03C 17/34 | (2006.01) |
| C09D 1/00 | (2006.01) |
| C09D 5/33 | (2006.01) |
| C23C 14/08 | (2006.01) |
| C23C 14/10 | (2006.01) |
| C23C 14/35 | (2006.01) |

(52) U.S. Cl.
CPC ............ *C09D 5/004* (2013.01); *C23C 14/083* (2013.01); *C23C 14/10* (2013.01); *C23C 14/35* (2013.01); *G02B 5/0891* (2013.01); *C03C 2217/734* (2013.01)

(58) Field of Classification Search
CPC ............ H01S 5/02461; H01S 5/18305; H01S 5/18341; H01S 5/18361; H01S 5/18369; H01L 31/06; H01L 31/035218
USPC .................. 359/357–360; 372/45.01, 46.01; 428/325, 411.1, 702; 438/26, 29
See application file for complete search history.

(56) References Cited

U.S. PATENT DOCUMENTS

| | | | |
|---|---|---|---|
| 5,038,356 A * | 8/1991 | Botez | H01S 5/18369 |
| | | | 257/15 |
| 5,298,048 A | 3/1994 | Lingle et al. | |
| 5,318,685 A | 6/1994 | Oshaughnessy | |
| 5,332,618 A | 7/1994 | Austin | |
| 5,563,734 A | 10/1996 | Wolfe et al. | |
| 5,643,349 A | 7/1997 | Piper et al. | |
| 5,728,456 A | 3/1998 | Adair et al. | |
| 5,834,103 A | 11/1998 | Bond et al. | |
| 6,060,178 A | 5/2000 | Krisko | |
| 6,231,999 B1 | 5/2001 | Krisko | |
| 6,316,111 B1 | 11/2001 | Krisko | |
| 6,587,288 B2 | 7/2003 | Erz et al. | |
| 6,652,974 B1 | 11/2003 | Krisko | |
| 6,660,365 B1 | 12/2003 | Krisko et al. | |
| 6,802,943 B2 | 10/2004 | Stachowiak | |
| 6,838,159 B2 | 1/2005 | Eby et al. | |
| 6,919,133 B2 | 7/2005 | Hartig et al. | |
| 6,964,731 B1 | 11/2005 | Krisko et al. | |
| 6,974,629 B1 | 12/2005 | Krisko et al. | |
| 7,037,589 B2 | 5/2006 | Hartig et al. | |
| 7,063,893 B2 | 6/2006 | Hoffman | |
| 7,067,195 B2 | 6/2006 | Hoffman et al. | |
| 7,122,252 B2 | 10/2006 | Hoffman | |
| 7,138,182 B2 | 11/2006 | Krisko et al. | |
| 7,157,123 B2 | 1/2007 | Hartig | |
| 7,241,506 B2 | 7/2007 | Hartig | |
| 7,309,527 B2 | 12/2007 | Oshaughnessy et al. | |
| 7,339,728 B2 | 3/2008 | Hartig | |
| 7,419,729 B2 | 9/2008 | Ewasko et al. | |
| 8,062,700 B2 | 11/2011 | Nun et al. | |
| 8,574,718 B2 | 11/2013 | Stull | |
| 8,679,634 B2 | 3/2014 | Imran et al. | |
| 8,895,149 B2 | 11/2014 | Imran et al. | |
| 8,895,150 B1 | 11/2014 | Stull | |
| 8,940,399 B2 | 1/2015 | Wuillaume et al. | |
| 9,096,041 B2 | 8/2015 | Nun et al. | |
| 9,733,403 B2 | 8/2017 | Disteldorf et al. | |
| 10,513,459 B2 | 12/2019 | Boyum et al. | |
| 2004/0258947 A1 | 12/2004 | Moelle et al. | |
| 2005/0025982 A1 | 2/2005 | Krisko et al. | |
| 2006/0090834 A1 | 5/2006 | Huang et al. | |
| 2006/0121315 A1 * | 6/2006 | Myli | C03C 17/36 |
| | | | 428/702 |
| 2007/0009745 A1 | 1/2007 | Hoffman | |
| 2007/0009747 A1 | 1/2007 | Medwick et al. | |
| 2007/0102291 A1 | 5/2007 | Hartig | |
| 2007/0128449 A1 | 6/2007 | Taylor et al. | |
| 2007/0193876 A1 * | 8/2007 | Chu | C23C 14/022 |
| | | | 204/192.1 |
| 2007/0248756 A1 | 10/2007 | Krisko et al. | |
| 2007/0281171 A1 | 12/2007 | Coster et al. | |
| 2008/0311389 A1 | 12/2008 | Roquiny et al. | |
| 2009/0130409 A1 | 5/2009 | Reutler et al. | |
| 2009/0176086 A1 | 7/2009 | Martin et al. | |
| 2009/0233037 A1 | 9/2009 | Medwick et al. | |
| 2009/0233071 A1 | 9/2009 | Medwick et al. | |
| 2010/0035036 A1 | 2/2010 | McCloy et al. | |
| 2010/0062245 A1 | 3/2010 | Martin et al. | |
| 2010/0221575 A1 | 9/2010 | Stull | |
| 2011/0085233 A1 * | 4/2011 | Furusato | G02B 1/115 |
| | | | 359/359 |
| 2011/0236715 A1 | 9/2011 | Polcyn et al. | |
| 2012/0219821 A1 | 8/2012 | Frank et al. | |
| 2012/0225317 A1 | 9/2012 | Imran et al. | |
| 2014/0072784 A1 | 3/2014 | Dietrich et al. | |
| 2015/0015940 A1 * | 1/2015 | Nakajinna | B32B 7/02 |
| | | | 359/359 |
| 2015/0020745 A1 | 1/2015 | Imamura et al. | |
| 2015/0043606 A1 * | 2/2015 | Hamaguchi | H01S 5/0425 |
| | | | 372/50.11 |
| 2015/0345005 A1 | 12/2015 | Ding et al. | |
| 2016/0223729 A1 | 8/2016 | Medwick et al. | |
| 2017/0299786 A1 | 10/2017 | Boyum et al. | |
| 2018/0319703 A1 | 11/2018 | Boyum et al. | |

FOREIGN PATENT DOCUMENTS

| | | |
|---|---|---|
| EP | 1071832 B1 | 9/2002 |
| EP | 1842835 A2 | 10/2007 |
| WO | 0138249 A1 | 5/2001 |
| WO | 0218132 A2 | 3/2002 |
| WO | 2006122900 A1 | 11/2006 |
| WO | 2009114493 A1 | 9/2009 |
| WO | 2010053921 A1 | 5/2010 |
| WO | 2012118469 A1 | 9/2012 |
| WO | 2014164695 A1 | 10/2014 |
| WO | 2015093322 A1 | 6/2015 |
| WO | 2017184568 A1 | 10/2017 |

OTHER PUBLICATIONS

Lobmann et al., "Industrial Processing of TiO2 thin Films from Soluble Precursor Powders," Glass Sci. Technology, 2003, pp. 1-7, vol. 76, No. 1.

Written Opinion of the International Searching Authority for International Patent Application No. PCT/US2016/054134, dated Nov. 30, 2016 (8 pages).

First Office Action for Brazilian Patent Application No. PI 0921674-0, dated Sep. 24, 2018, with English translation (6 pages).

International Search Report and Written Opinion of the International Searching Authority for International Patent Application No. PCT/US2017/028071, dated Oct. 10, 2017 (12 pages).

International Search Report and Written Opinion of the International Searching Authority for International Patent Application No. PCT/US2018/022449, dated Jun. 14, 2018 (14 pages).

Office Action for European Patent Application No. 09748654.2, dated Feb. 19, 2018 (7 pages).

Medwick, Paul A., "U.S. Appl. No. 61/035,587—"Solar Mirror, dated Mar. 11, 2008, 28 pages.

National Institute of IP, "Chilean Examination and Search Report", Application No. 1000-2011, dated Feb. 18, 2014, 10 pages.

PCT, "International Preliminary Report on Patentability", Application No. PCT/US2009/063149, dated May 10, 2011, 11 page.

PCT, "International Search Report and Written Opinion", Application No. PCT/US2009/063149, dated Feb. 9, 2010, 17 pages.

Special Metals Corporation, "Inconel alloy 600 product literature", http://www.specialmetals.com; Accessed Jun. 26, 2014, Sep. 2008, 16 pages.

Office Action and Search Report issued for Chilean Patent Application No. 201802957 dated Oct. 14, 2019.

(56) References Cited

OTHER PUBLICATIONS

Extended European Search Report received for European Patent Application No. 19207488.8 dated Mar. 9, 2020, 9 pages.

* cited by examiner

NEAR INFRARED REFLECTIVE COATINGS

TECHNICAL FIELD

The invention relates to coatings that are substantially reflective to electromagnetic radiation in the near infrared region of the spectrum, yet are substantially transparent to electromagnetic radiation in the visible region of the spectrum.

BACKGROUND

Liquid crystal (LC) technology is widely used for displays (LC displays, or LCD) in notebook and other smaller computers. Like light-emitting diode (LED) and gas-plasma technologies, LC technology allows displays to be much thinner than cathode ray tube (CRT) technology. LCDs consume much less power than LED and gas-display technologies.

An LCD is made with either a passive matrix or an active matrix display display grid. The passive matrix LCD has a grid of conductors with pixels located at each intersection in the grid. A current is sent across two conductors on the grid to control the light for any pixel. The active matrix LCD is also known as a thin film transistor (TFT) display and is the superior technology for rapid screen refresh rates. An active matrix has a transistor located at each pixel intersection, requiring less current to control the luminance of a pixel. For this reason, the current in an active matrix display can be switched on and off more frequently, improving the screen refresh time. Applying a current to the LC environment causes a phase change of the liquid crystals that in turn controls the amount of light passing through each pixel location. In this way, liquid crystals control the image ultimately viewed by a viewer.

LCDs are currently used widely for indoor applications. However, use of LCDs in outdoor displays is a challenge in the industry. In general, LCDs are not rated for use at temperatures over about 50° C. because the liquid crystals widely used in LC devices lose their ability to organize in the phase that allows light transmission above this temperature. Stated differently, LC devices have a well-defined isotropic or operating temperature limit, above which the liquid crystal molecules lose their liquid crystalline orientation (nematic phase) and assume a random orientation, i.e. a conventional isotropic liquid phase. Isotropic conditions cause positive image displays to become dark and negative image displays to become transparent. This is commonly termed the Nematic-to-Isotropic Transition or NI Transition. Since the most widely used LCDs are positive image displays, an LC display subjected to temperatures above 50° C. appears to "go black".

High temperature LCD applications thus require heat dissipation technologies to retain operability of the display. Commonly this approach employs mechanical heat dissipation—that is, fans. Such additional equipment adds greatly to the operating cost, complication, and bulk of the displays which is undesirable in the industry. Very large displays require a commensurately large amount of heat dissipation, making them impractical for use in environments where temperatures over 50° C. are encountered. Most LCD manufacturers will not warranty their products for temperatures in excess of 50° C.

One of the most common heat sources in outdoor or outdoor-facing use of LCDs is sunlight. Sunlight reaching the earth's surface comprises ultraviolet, visible, and infrared irradiation. At zenith, sunlight provides an irradiance of just over 1 kilowatt per square meter at sea level. Of this energy, 527 watts is infrared radiation (wavelengths of about 750 nm to 1 mm), 445 watts is visible light (wavelengths of about 380 nm to 750 nm), and 32 watts is ultraviolet radiation (wavelengths of about 10 nm to 380 nm). The majority of infrared radiation reaching the earth is in the near-infrared (NIR) region, which is the highest-energy (shortest wavelength) infrared radiation and is defined as the range of about 750 nm to 1400 nm Sunlight can thus provide a substantial amount of NIR irradiation to outdoor displays or displays situated inside a building and proximal to a window. Most outdoor displays are situated within a glass enclosure for protection from weather, vandalism, and the like. If an LCD panel is exposed to a direct sun load behind a glass panel, such as an enclosure or a window, on-surface temperature can easily rise to more than +60° C., or even more, above ambient temperature. In practice this means that if sun-exposed LCD operates behind a window where the surrounding environment is set to an ambient temperature of 20° C. (e.g., a building), the sun load will raise on-surface temperature to 80° C. or greater. Outdoor applications are subjected to even harsher conditions, for example during the summer when ambient temperatures can exceed 35° C. As stated above, LCDs will not operate at such temperatures and thus require some way to dissipate heat.

Thus, there is a need in the industry for a protective covering or enclosure for an LCD that reflects a substantial portion of NIR wavelengths while providing good transparency in the visible range of light. Such a protective covering would reflect the majority of infrared radiation from the sun while allowing good optical visibility of the LCD. The covering could be used e.g., as a direct cover on the LCD itself, or as part of a window or enclosure subjected to direct sunlight in an outdoor environment or subjected to another source of NIR radiation. There is a need in the industry for such a protective covering to be easily manufactured.

Laminated window constructions such as HEAT MIRROR® sold by the Eastman Chemical Co. of Kingsport, Tenn. are designed to provide optical transparency and NIR reflectivity. However, such laminates are formed by sandwiching (laminating) an NIR-reflective film between two sheets of glass. The films themselves are not robust enough to use alone. The films are difficult to manufacture and the three-sheet lamination is complicated. To get satisfactory reflection of NIR, in some cases many layers of the NIR-reflective film are employed in the laminates, increasing both the level of complication and the cost of manufacturing.

There is a need in the industry for coatings that can be applied directly to substrates, such as glass, that allow optical transparency and NIR reflectivity. Such coatings would reduce the complication level of manufacturing and provide a single substrate sheet that accomplishes this goal, further without the use of additional equipment to distribute heat, such as fans. There is a need in the industry to provide such coatings on a single major side of a single substrate sheet, thereby further simplifying manufacturing or allowing the second major side of the substrate sheet to include additional coatings or treatments suitable for a particular application.

SUMMARY

Disclosed herein is a coating composition comprising 10 to 20 alternating layers of $SiO_2$ and one of $ZrO_2$ or $Nb_2O_5$ wherein the thickness of each individual layer is about 70 nm to 200 nm. In some embodiments, the top layer and the bottom layer of the alternating layers are different from each other in terms of composition, thickness, or both. In some embodiments, the top layer of the composition further comprises a layer of $TiO_2$. In some such embodiments, the $TiO_2$ layer is about 0.5 nm to 5 nm thick.

Also disclosed herein is a substantially planar substrate comprising a coating on at least a first major side thereof, the coating comprising 6 to 20 alternating layers of $SiO_2$ and one of $ZrO_2$ or $Nb_2O_5$ wherein a thickness of each individual layer is about 70 nm to 200 nm. In some embodiments, the substantially planar substrate is glass. In some such embodiments, the glass is tempered glass. In some embodiments, the substrate is about 1 mm to 10 mm thick and optionally comprises one or more substrate layers. In some such embodiments the one or more substrate layers comprise impact resistant layers. In some embodiments, the planar substrate comprises glass, poly(methyl methacrylate), or a polycarbonate. In some embodiments, the bottom layer and the top layer of the alternating layers of the coating are different from each other in terms of composition, thickness, or both, wherein the bottom layer contacts the substrate surface. In some embodiments, the bottom layer of the coating is the layer directly contacting the substrate surface, wherein the bottom layer comprises $ZrO_2$ or $Nb_2O_5$. In some embodiments, the top layer of the coating is the layer of the coating composition that is furthest from the substrate surface, wherein the last layer comprises $SiO_2$. In some embodiments, the top layer further comprises a layer of $TiO_2$. In some such embodiments, the $TiO_2$ layer is about 0.5 nm to 5 nm thick.

Also disclosed herein is a method of making a coated substrate, the method comprising the steps of providing a substantially planar substrate having a first major surface, and depositing a coating composition on the first major surface, the coating composition comprising 6 to 20 alternating layers of $SiO_2$ and one of $ZrO_2$ or $Nb_2O_5$ wherein a thickness of each individual layer is about 70 nm to 200 nm. In some such embodiments, the layers are deposited by magnetron sputtering. In some such embodiments, the sputtering of $SiO_2$ is carried out using a $SiO_x$ target. In some embodiments, the sputtering of $ZrO_2$ or $Nb_2O_5$ is carried out using a $ZrO_x$ target or an $Nb_2Ox$.

DETAILED DESCRIPTION

Although the present disclosure provides references to preferred embodiments, persons skilled in the art will recognize that changes may be made in form and detail without departing from the spirit and scope of the invention. Various embodiments will be described in detail with reference to the drawings, wherein like reference numerals represent like parts and assemblies throughout the several views. Reference to various embodiments does not limit the scope of the claims attached hereto. Additionally, any examples set forth in this specification are not intended to be limiting and merely set forth some of the many possible embodiments for the appended claims. The materials, methods, and examples disclosed herein are illustrative only and not intended to be limiting. Preferred methods and materials are described below, although methods and materials similar or equivalent to those described herein can be used in practice or testing of the present invention. All publications, patent applications, patents and other references mentioned herein are incorporated by reference in their entirety and for all purposes.

Definitions

Unless otherwise defined, all technical and scientific terms used herein have the same meaning as commonly understood by one of ordinary skill in the art. In case of conflict, the present document, including definitions, will control.

The terms "comprise(s)," "include(s), " "having," "has," "can," "contain(s)," and variants thereof, as used herein, are intended to be open-ended transitional phrases, terms, or words that do not preclude the possibility of additional acts or structures. The singular forms "a," "and" "the" include plural references unless the context clearly dictates otherwise. The present disclosure also contemplates other embodiments "comprising," "consisting of" and "consisting essentially of," the embodiments or elements presented herein, whether explicitly set forth or not.

As used herein, the term "optional" or "optionally" means that the subsequently described event or circumstance may but need not occur, and that the description includes instances where the event or circumstance occurs and instances in which it does not.

As used herein, the term "about" modifying, for example, the quantity of an ingredient in a composition, concentration, volume, process temperature, process time, yield, flow rate, pressure, and like values, and ranges thereof, employed in describing the embodiments of the disclosure, refers to variation in the numerical quantity that can occur, for example, through typical measuring and handling procedures used for making compounds, compositions, concentrates or use formulations; through inadvertent error in these procedures; through differences in the manufacture, source, or purity of starting materials or ingredients used to carry out the methods, and like proximate considerations. The term "about" also encompasses amounts that differ due to aging of a formulation with a particular initial concentration or mixture, and amounts that differ due to mixing or processing a formulation with a particular initial concentration or mixture. Where modified by the term "about" the claims appended hereto include equivalents to these quantities. Further, where "about" is employed to describe a range of values, for example "about 1 to 5" the recitation means "about 1 to about 5" and "1 to about 5" and "about 1 to 5" unless specifically limited by context.

As used herein, the word "substantially" modifying, for example, the type or quantity of an ingredient in a composition, a property, a measurable quantity, a method, a position, a value, or a range, employed in describing the embodiments of the disclosure, refers to a variation that does not affect the overall recited composition, property, quantity, method, position, value, or range thereof in a manner that negates an intended composition, property, quantity, method, position, value, or range. Examples of intended properties include, solely by way of nonlimiting examples thereof, flexibility, partition coefficient, rate, solubility, temperature, and the like; intended values include thickness, yield, weight, concentration, and the like. The effect on methods that are modified by "substantially" include the effects caused by variations in type or amount of materials used in a process, variability in machine settings, the effects of ambient conditions on a process, and the like wherein the manner or degree of the effect does not negate one or more intended properties or results; and like proximate considerations. Where modified by the term "substantially" the claims appended hereto include equivalents to these types and amounts of materials.

Discussion

Disclosed herein is a coating composition comprising about 6 to 20 consecutive and alternating layers of a first oxide (e.g., $ZrO_2$) and at least a second oxide (e.g., $SiO_2$) wherein the thickness of each individual layer is about 70 nm to 200 nm, for example about 70 nm to 195 nm, or about 70 nm to 190 nm, or about 70 nm to 185 nm, or about 70 nm to 180 nm, or about 70 nm to 175 nm, or about 70 nm to 170 nm, or about 70 nm to 165 nm, or about 70 nm to 160 nm, or about 70 nm to 155 nm, or about 70 nm to 150 nm, or about 70 nm to 145 nm, or about 70 nm to 140 nm, or about 70 nm to 135 nm, or about 70 nm to 130 nm, or about 75 nm to 200 nm, or about 80 nm to 200 nm, or about 85 nm to 200 nm, or about 90 nm to 200 nm, or about 95 nm to 200 nm, or about 100 nm to 200 nm, or about 80 nm to 190 nm, or about 90 nm to 180 nm, or about 90 nm to 170 nm, or about 100 nm to 170 nm, or about 100 nm, to 160 nm, or about 100 nm to 150 nm. The thickness of any one layer does not limit the thickness of another layer; each layer can differ from any other layer. In some embodiments, the first layer and the last layer of the alternating layers are different from each other in terms of composition, thickness, or both. In some embodiments, the first and last layer of the alternating layers are substantially identical in terms of composition.

The number of layers in the coating composition comprises, consists essentially of, or consists of 6 to 20 layers, or 6 to 19 layers, or 6 to 18 layers, or 6 to 17 layers, or 6 to 16 layers, or 6 to 15 layers, or 6 to 14 layers, or 6 to 13 layers, or 6 to 12 layers, or 6 to 11 layers, or 6 to 10 layers, or 7 to 20 layers, or 8 to 20 layers, or 8 layers to 12 layers, or 9 to 20 layers, or 10 to 20 layers, or 11 to 20 layers, or 12 to 20 layers, or 13 to 20 layers, or 14 to 20 layers, or 15 to 20 layers, or 16 to 20 layers, or 17 to 20 layers, or 18 to 20 layers, or 19 to 20 layers, or 6 layers, or 7 layers, or 8 layers, or 9 layers, or 10 layers, or 11 layers, or 12 layers, or 13 layers, or 14 layers, or 15 layers, or 16 layers, or 17 layers, or 18 layers, or 19 layers, or 20 layers, wherein the layers are alternating layers comprising, consisting essentially of, or consisting of a first oxide and a second oxide, wherein the first and second oxides are different oxides such as silicon dioxide ($SiO_2$) and zirconium dioxide ($ZrO_2$), or a niobium oxide ($NbO_x$ or $Nb_2O_x$ such as niobium pentoxide $Nb_2O_5$) and $SiO_2$. The oxides in the alternating layers can include one or more of metal oxides, such as $ZrO_2$, $TiO_2$, or $NbO_x$ (e.g., $Nb_2O_5$); or non-metal oxides such as silicon dioxides. The coating composition is deposited on a substrate, such as glass or another substrate. In some embodiments, the substrate is substantially planar and the coating composition is deposited on at least one major side thereof. In some embodiments, the substrate is optically transparent.

Figure 1:
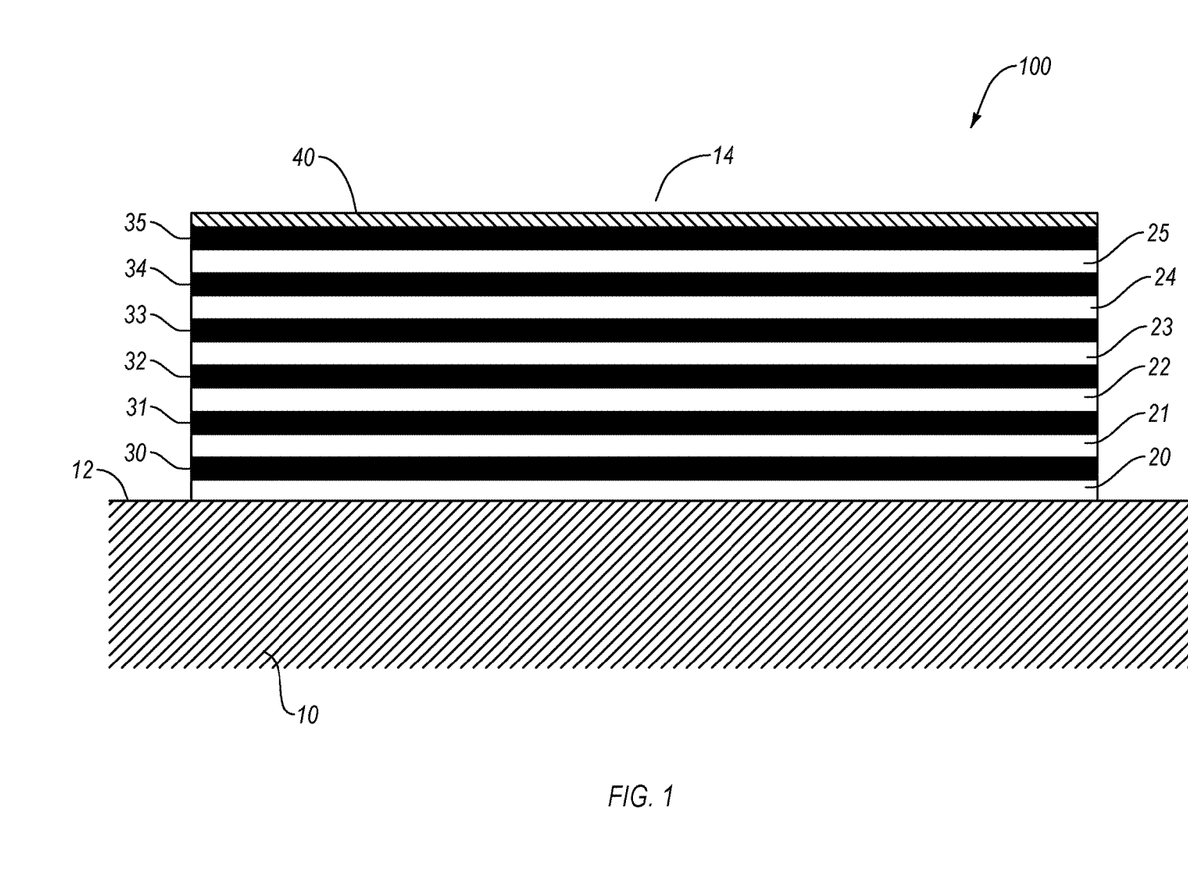
FIG. 1 is a schematic representation of a coated substrate of the invention.

FIG. 1 shows an exemplary, but nonlimiting, embodiment of a substrate having a coating composition of the invention disposed thereon. Referring to FIG. 1, coated substrate 100 includes a substantially planar substrate 10 having first major surface 12 with a coating composition 14 of the invention coated thereon. Coating composition 14 includes six first oxide layers 20, 21, 22, 23, 24, 25 with the bottom first oxide layer 20 disposed in contact with substrate 10 at first major surface 12. Layers 20, 21, 22, 23, 24, 25 are each about 70 nm to 200 nm thick. Coating composition 14 further include six second oxide layers 30, 31, 32, 33, 34, 35 disposed in interleaved or alternating fashion between the first oxide layers 20, 21, 22, 23, 24, 25. Thus, top layer 35 is a second oxide layer. Layers 30, 31, 32, 33, 34, 35 are each about 70 nm to 200 nm thick. The embodiment of FIG. 1 thus represents 12 alternating layers of first and second oxides such as zirconium dioxide and silicon dioxide deposited in the order 20, 30, 21, 31, 22, 32, 23, 33, 24, 34, 25, 35 wherein each layer 20, 30, 21, 31, 22, 32, 23, 33, 24, 34, 25, 35 is between about 70 nm and 200 nm thick. Deposited on top layer 35 is a layer of titanium dioxide 40. Titanium dioxide layer 40 is about 0.5 nm to 5 nm thick.

In embodiments, the alternating layers of the coating composition can include alternating layers of $NbO_x$ (e.g., $Nb_2O_5$) and $SiO_2$. For example, a coating composition may include four layers each of $Nb_2O_5$ and $SiO_2$ arranged in alternating order to provide at least an eight layer coating. Each of the layers of $Nb_2O_5$ and $SiO_2$ may be 70 nm to 200 nm thick, such as about 80 nm to about 155 nm thick. In some embodiments, the at least an eight layer coating may include an additional titanium dioxide layer 40 as disclosed above. The at least an eight layer coating may additionally include one or more additional protective layers disposed thereon, such as a UV coating layer as discussed in more detail below. In an embodiment, a coating composition may include five layers each of $Nb_2O_5$ and $SiO_2$ to provide at least a ten layer coating. Each of the layers of $Nb_2O_5$ and $SiO_2$ may be 70 nm to 200 nm thick, such as about 80 nm to about 155 nm thick. In some embodiments, the at least a ten layer coating may include an additional titanium dioxide layer 40 as disclosed above. The at least a ten layer coating may additionally include one or more additional protective layers disposed thereon, such as a UV coating layer. The $NbO_x$-containing coatings can be similar or identical to the coating illustrated in FIG. 1 in one or more aspects. For example, a coated substrate can include six layers of each of $Nb_2O_5$ and $SiO_2$, arranged in an alternative configuration. In such embodiments, the layers 20, 21, 22, 23, 24, and 25 $Nb_2O_x$ (e.g., $Nb_2O_5$) layers and the layers 30, 31, 32, 33, 34, 35 can be silicon dioxide.

In some embodiments, the coating composition can have three or more alternating layers, such as alternating $ZrO_2$, $Nb_2O_5$, and $SiO_2$ layers. For example, a first layer may include $ZrO_2$, a second layer may include $SiO_2$, a third layer may include an $Nb_2O_5$, and a fourth layer may include $SiO_2$. Such a layered configuration may be repeated one or more times to form a coating composition. In an embodiment, the first layer may include $ZrO_2$, the second layer may include $Nb_2O_5$, and the third layer may include $SiO_2$. Such a layered configuration may be repeated one or more times to form a coating composition. We have found that the coating compositions of the invention are useful for providing NIR reflectivity when disposed on a substrate. That is, the coating compositions are substantially reflective to electromagnetic radiation having wavelengths in the range of 710 nm to 1400 nm. In particular, the coating compositions are substantially reflective to electromagnetic radiation having wavelengths in the range of about 710 nm to 1050 nm, or about 740 nm to 1050 nm, or about 740 nm to 1000 nm, or about 750 nm to 1400 nm, or about 750 nm to 1375 nm, or about 750 nm to 1350 nm, or about 750 nm to 1300 nm, or about 750 nm to 1250 nm, or about 750 nm to 1200 nm, or about 750 nm to 1190 nm, or about 750 nm to 1180 nm, or about 750 nm to 1170 nm, or about 750 nm to 1160 nm, or about 760 nm to 1400 nm, or about 770 nm to 1400 nm, or about 780 nm to 1400 nm, or about 780 nm to 1300 nm, or about 780 nm to 1250 nm, or about 780 nm to 1200 nm, or about 780 nm to 1190 nm, or about 780 nm to 1180 nm, or about 780 nm to 1170 nm, or about 780 nm to 1160 nm, or about 780 nm to 980 nm, or about 800 nm to 1140 nm, or about 820 nm to 1115 nm, or about 840 nm to 1070 nm Within the above listed ranges of NIR wavelengths, the coatings of the composition reflect greater than 50% of directly incident light (that is, light directed at the coating at an angle of 90° from the plane of the planar coating), for example about 50% to 99% reflectivity within one or more of the ranges of NIR wavelengths recited above, or about 55% to 99%, or about 60% to 99%, or about 65% to 99%, or about 70% to 99%, or about 75% to 99%, or about 80% to 99%, or about 50% to 98%, or about 50% to 97%, or about 50% to 96%, or about 50% to 95%, or about 50% to 94%, or about 50% to 93%, or about 50% to 92%, or about 50% to 91%, or about 50% to 90%, or about 50% to 85%, or about 50% to 80%, or about 70% to 95%, or about 80% to 95% reflectivity within one or more of the ranges of NIR wavelengths recited above.

At the same time, we have found that the coating compositions of the invention are useful for providing good optical transparency when provided on a substrate. That is, the coating compositions are substantially transmissive to visible light, or electromagnetic radiation having wavelengths in the range of 380 nm to 750 nm Thus, the coating compositions are useful for viewing a display therethrough, while still reflecting a substantial amount of NIR radiation.

We have found that the coating compositions of the invention are useful for providing visible light transmission when disposed on a substrate. That is, the coating compositions are substantially transmissive to electromagnetic radiation having wavelengths in the range of 380 nm to 750 nm. In particular, the coating compositions are substantially transmissive to electromagnetic radiation having wavelengths in the range of about 380 nm to 740 nm, or about 380 nm to 730 nm, or about 380 nm to 720 nm, or about 380 nm to 710 nm, or about 380 nm to 700 nm, or about 380 nm to 690 nm, or about 380 nm to 680 nm, or about 380 nm to 670 nm, or about 380 nm to 660 nm, or about 390 nm to 750 nm, or about 400 nm to 750 nm, or about 450 nm to 750 nm, or about 460 nm to 750 nm, or about 470 nm to 750 nm, or about 400 nm to 720 nm, or about 400 nm to 700 nm, or about 450 nm to 700 nm, or about 450 nm to 690 nm, or about 450 nm to 680 nm.

Within the above listed ranges of visible light wavelengths, the coatings of the composition transmit greater than 50% of directly incident light (that is, light directed at the coating at an angle of 90° from the plane of the planar coating), for example about 50% to 99.9% transmissivity within one or more of the ranges of visible wavelengths recited above, or about 55% to 99.9%, or about 60% to 99.9%, or about 65% to 99.9%, or about 70% to 99.9%, or about 75% to 99.9%, or about 80% to 99.9%, or about 85% to 99.9%, or about 90% to 99.9%, or about 95% to 99.9%, or about or about 50% to 99%, or about 50% to 98%, or about 50% to 97%, or about 50% to 96%, or about 50% to 95%, or about 50% to 94%, or about 50% to 93%, or about 50% to 92%, or about 50% to 91%, or about 50% to 90%, or about 50% to 85%, or about 50% to 80%, or about 80% to 95%, or about 90% to 99% reflectivity within one or more of the ranges of NIR wavelengths recited above.

In one exemplary embodiment, we have found that the coatings of the invention provide NIR reflectivity of about 80% to 95% between wavelengths of about 820 nm and 1070 nm and visible light transmissivity of about 80% to 99% or greater between wavelengths of about 380 nm and 700 nm. In another exemplary embodiment, we have found that the coatings of the invention provide NIR reflectivity of about 42% to 63% between wavelengths of about 800 nm and 1050 nm and visible light transmissivity of about 80% to 99% or greater between wavelengths of about 380 nm and 700 nm. In another exemplary embodiment, we have found that the coatings of the invention provide NIR reflectivity of about 70% to 89% between wavelengths of about 750 nm and 1020 nm and visible light transmissivity of about 80% to 99% or greater between wavelengths of about 380 nm and 700 nm. In another exemplary embodiment, we have found that the coatings of the invention provide NIR reflectivity of about 80% to 95% between wavelengths of about 750 nm and 1000 nm and visible light transmissivity of about 80% to 99% or greater between wavelengths of about 380 nm and 700 nm. In yet another exemplary embodiment, we have found that the coatings of the invention provide NIR reflectivity of about 86% to 99% between wavelengths of about 800 nm and 980 nm and visible light transmissivity of about 80% to 99% or greater between wavelengths of about 380 nm and 700 nm.

The consecutively applied layers of the coating compositions are applied to a target substrate using any technique or combination thereof known to those of skill to deposit thin films of metal oxide materials on a substrate. Any known layer deposition film techniques, chemical or physical, are suitably used alone or in combination to deposit layers of the coating composition according to the methods of the present invention. Examples of deposition techniques include, but are not limited to magnetron sputtering, wet chemical immersion, thermal evaporation, chemical vapor deposition, plasma assisted chemical deposition, ion plating, and ion beam deposition. Such techniques are used in-line, for example in a continuous process, or in batch mode as desired.

In embodiments, a useful technique to form the layers of the coating compositions of the invention is Mid-Frequency (MF) sputtering using magnetron sputtering techniques. Such techniques are well known to those of skill in the art of thin-film deposition of ceramic layers on glass or other substantially planar substrates. In some such embodiments, one or more of the individual (e.g., $Nb_2O_5$, $SiO_2$, or $ZrO_2$) layer types are sputtered using a technique commonly known as reactive sputtering. Reactive sputtering is a process where a target material, such as elemental Si, is sputtered in the presence of a gas, such as oxygen, or a mixture of gases such as that will react with the target material to form a coating of a different chemical composition (e.g., $SiO_2$). Argon is the most commonly employed inert gas mixed with e.g., oxygen. The amount of a reactive gas introduced into a process chamber is adjusted to produce a fully reacted compound.

Reactive sputtering deposition is a well-established technique and is widely used for industrial coating deposition. Reactive sputtering is employed for production of thin layers for high added value products, such as flat panel displays, solar cells, optical components, decorative finishes, and the like.

The driving force behind the widespread use of this technology is the fact that the process generally allows high coating deposition rates to be obtained using AC or DC power, thus providing a superior alternative to sputtering ceramic compound targets with RF power. Reactive sputtering processes can provide significant cost savings as well as production rate advantages. However, the deposition rate of $ZrO_2$ using a Zr target is very low using currently known technologies. For example, a representative optimized dynamic deposition rate of $ZrO_2$ using a Zr target is about 3.25 nm*m/min, resulting in a total deposition of e.g., a 4.27 nm thick layer for an in-line deposition carried out at 30 inches/minute (76.2 cm/min) Similarly, the deposition rate of $Nb_2O_5$ using an Nb target is very low using current technologies. For example, a representative optimized dynamic deposition rate of $Nb_2O_5$ using a Nb target is about 2.13 nm*m/min, resulting in a total deposition of e.g., a 2.79 nm thick layer for an in-line deposition carried out at 30 inches/minute (76.2 cm/min).

Recently, equipment has been made available that is suitable to directly sputter one or more of $ZrO_2$, $SiO_2$, or $Nb_2O_5$. That is, instead of reactively sputtering Zr, Si, Nb or another metallic material in the presence of oxygen to form the oxide, a ceramic target—that is, the oxide itself—is employed. In such cases, the sputtering is carried out using only an inert gas such as argon. One commercial source of such equipment is Soleras Advanced Coatings. Using a $ZrO_x$ target, a deposition rate of 10.73 nm*m/min can be achieved, resulting in a total deposition of e.g., a 10.73 nm thick layer for an in-line deposition carried out at 30 inches/minute (76.2 cm/min) At such deposition rates it is commercially feasible to provide relatively thick $ZrO_2$ layers, such as about 70 nm to 200 nm thick layers, alternating with $SiO_2$ layers deposited using either Si or $SiO_2$ targets for example. Similar deposition rates may be achieved with an NbOx target. Using direct sputtering of an NbOx (e.g., $Nb_2Ox$), can provide suitably thick layers (e.g., at least about 50 nm thick, such as about 70 nm to 200 nm thick) for use in the NIR protective coatings herein. Using a $Nb_2O_x$ target, a deposition rate of 16.03 nm*m/min can be achieved, resulting in a total deposition of e.g., a 21.04 nm thick layer for an in-line deposition carried out at 30 inches/minute (76.2 cm/min)

The individual layers of the coating composition are deposited consecutively on a substrate to form an article of the invention. Typically, but not always, the depositions are carried out on substantially planar substrates such as plates, sheets, or the like formed from an optically transparent substrate such as glass, polycarbonate, or polymethyl methacrylate. However, opaque substrates such as metals or painted surfaces and the like are suitably employed as substrates as well. Additionally, using some of the above-listed techniques, it is possible to provide the coating composition on a non-planar substrate.

Any substrate where optical transparency of the surface, or the entirety of the substrate, combined with NIR reflectivity is desired is usefully coated with the coating composition of the invention. In some embodiments, the substrate is about 1 mm to 10 mm thick and optionally comprises one or more substrate layers. Potential applications include automobile windows and windshields, including layered glass windows such as impact-resistant glass, or other automobile body parts such as a painted panels and the like; tempered glass; laboratory glass or other equipment; windows for buildings; solar panel protective coverings; protective cases for such as for artwork; protective coverings for electronic or other temperature sensitive machines or devices to be used outdoors; roofing or siding articles for buildings; and other such applications as will be readily appreciated by one of skill. Where the substrate is opaque, the coating composition is deposited substantially on a surface that is intended for direct exposure to sunlight or another source of NIR radiation. It will be appreciated by those of skill that sources of NIR radiation other than sunlight are also effectively reflected using a coating of the invention. Thus, equipment shields in one or more laboratory or manufacturing areas allow workers to view the processes going on via an optically transparent substrate that reflects NIR radiation emanating from the equipment; alternatively, one or more processes in the area may generate NIR radiation and sensitive equipment may be shielded by a panel having a coating composition of the invention disposed thereon. Many other uses of the coatings are envisioned and such uses are not limited by the recitations herein.

Where the substrate is optically transparent or substantially optically transparent—such as translucent—the coating composition is deposited on either a surface that is intended for exposure to sunlight or another source of NIR radiation, or on another surface intended for indirect exposure to NIR radiation. For example, a window pane is substantially planar and optically transparent; the coating composition of the invention is suitably deposited either on the a first major side thereof, which is the side intended to face the outside of a building, or on the second major side thereof, which is the side intended to face the interior of the building. In any case, the location of the coating deposition on a substrate is selected by one of skill depending on the intended end use, economic or manufacturing efficiency, or both.

In embodiments, the coating composition is deposited on a substantially planar substrate, wherein the substrate has a first major side and second major side, and wherein the first major side includes a coating composition of the invention. In some embodiments, the substantially planar substrate is about 1 mm to 10 mm thick, or about 2 mm to 10 mm, 3 mm to 10 mm, 4 mm to 10 mm, 5 mm to 10 mm, 1 mm to 9 mm, 1 mm to 8 mm, 1 mm to 7 mm, 1 mm to 6 mm, 1 mm to 5 mm, or 1 mm to 4 mm thick. In some embodiments, the substantially planar substrate comprises one, two, or more substrate layers. For example, impact resistant glass generally comprises two glass layers with a layer of thermoplastic film disposed between the glass layers. Other such substrates are also suitably coated on at least a first major side thereof.

The coated substrates are useful, in one type of exemplary but nonlimiting embodiment, for shielding or enclosing an outdoor LCD display. In some such embodiments, the substrate is thus manufactured and coated as part of an outdoor enclosure assembly specifically for holding an LCD device, or alternatively as a window portion of a building wherein the LCD device will be situated immediately proximal to the window on the interior of the building and thus exposed to direct sunlight. In some such embodiments, the substrate first major side is disposed advantageously on the exterior of the window, shield, or enclosure, where it effectively reflects NIR radiation but allows visible light to be transmitted through and an LCD device to be viewed by a viewer external to the shield, enclosure, or building. In such embodiments, an LCD device disposed within the outdoor LCD display enclosure is suitably maintained at a temperature below about 50° C. when placed outdoors, or at a temperature less than about 10° C. above ambient temperature when exposed to noon-hour sunlight without shielding by shadows caused by clouds, buildings, and the like and further without any other special devices for heat diffusion or cooling. In other such embodiments, an LCD device disposed proximal to the window portion of a building, the window having a coating composition of the invention disposed thereon, is suitably maintained at a temperature below about 50° C., or at a temperature less than about 10° C. above ambient temperature when the coated window is exposed to noon-hour sunlight without shielding by shadows caused by clouds, buildings, and the like and further without any other special devices for heat diffusion or cooling.

In embodiments, the coating composition is deposited on a substantially planar substrate, wherein the substrate has a first major side and second major side, and wherein the first major side includes a coating composition of the invention. In some embodiments, the second major side of the substrate includes another coating composition of the invention. In other embodiments, the second major side of the substrate includes a different coating, for example a UV reflective, optically transparent coating. Such coatings are described, for example, in U.S. Pat. No. 5,332,618, the contents of which are incorporated herein in their entirety and for all purposes. Such coatings are optically transparent and reflect UV wavelengths, providing further protection from UV radiation from e.g., sunlight. Thus, dual protection is available in such double-coated substrates, wherein the substrate is rendered both UV and NIR reflective while optical transparency is retained.

In some embodiments, the bottom layer of the coating composition is the layer that contacts the substrate. In some embodiments, the bottom layer is $ZrO_2$ or $Nb_2O_5$. In some such embodiments, the substrate comprises glass. In some embodiments, the top layer of the coating composition is the layer that contacts the air, or otherwise is the final layer of the coating composition. In some embodiments, the top layer of the coating composition is $SiO_2$. In some embodiments, the bottom layer may be SiO2 and the top layer can be $ZrO_2$ or $Nb_2O_5$.

In some embodiments, the coating composition further comprises a layer of $TiO_2$. In some such embodiments, the $TiO_2$ layer is disposed on the top layer of the alternating oxide layer (e.g., $ZrO_2/SiO_2$ layers), wherein the bottom layer contacts the substrate. In some such embodiments, the $TiO_2$ layer is about 0.5 nm to 5 nm thick, or about 1 nm to 5 nm, or about 1.5 nm to 5 nm, or about 2 nm to 5 nm, or about 2.5 nm to 5 nm, or about 3 nm to 5 nm, or about 4 nm to 5 nm, or about 0.5 nm to 4 nm, or about 0.5 nm to 3.5 nm, or about 0.5 nm to 3 nm, or about 0.5 nm to 2.5 nm, or about 0.5 nm to 2 nm, or about 0.5 nm to 1.5 nm, or about 0.5 nm to 1 nm, or about 1 nm to 4 nm, or about 1 nm to 3 nm, or about 1.5 nm to 3 nm thick. The $TiO_2$ layer provides increased hydrophobicity to the surface of the composition without substantially changing the optical clarity (visible light transparency) or NIR reflectivity of the coating composition disposed beneath it. In other embodiments, one or more additional coating compositions are suitably disposed on top of the $TiO_2$ layer or instead of the $TiO_2$ layer for various purposes, including UV blocking, weather resistance, hydrophobicity, cleanability, and the like.

In some embodiments, the coating compositions of the invention are deposited only on a portion of a substrate surface for a particular purpose. Thus, the coating may be added only to a portion of a substrate major surface, or a portion of the substrate major surface is masked to prevent deposition of the coating of the invention thereon. Additionally, a gradient NIR reflective surface is formed in some embodiments by masking a portion of the substrate first major surface, or multiple portions of a first major surface of a substrate; depositing one or more of the alternating $ZrO_2/SiO_2$ or $Nb_2O_5/SiO_2$ layers thereon; demasking all or a portion of the masked first major surface prior to deposition of one or more additional layers of the alternating $ZrO_2/SiO_2$ or $Nb_2O_5/SiO_2$ layers thereon; and so forth without limitation up to the entirety of the 20 alternating layers. In some such embodiments it may be desirable to coat a portion of the gradient NIR reflective surface with more than 20 layers thereof for a particular purpose.

EXAMPLES

Computer modeling was employed to optimize coating layer thickness and number of layers. The modeling was done using a software modeling package, TFCalc 3.5.15: Thin Film Design Software for Windows, made by Software Spectra, Inc. of Portland, Oreg.

The reflectance curves generated are based on light perpendicular to the plane of the coating/substrate and is an average of s and p polarizations.

Example 1

Figure 2:
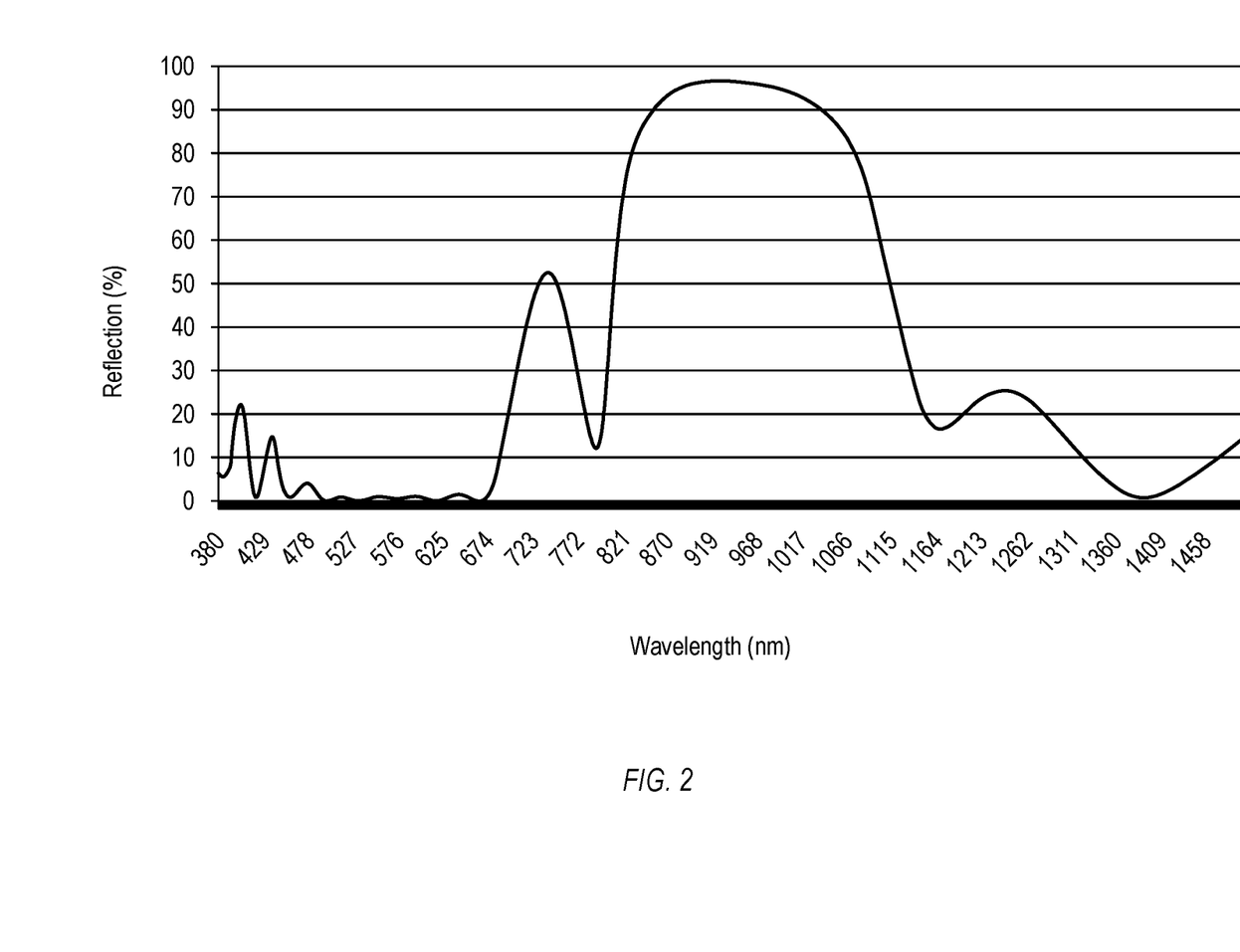
FIG. 2 is a plot of % reflection of electromagnetic radiation of a coating composition of the invention, as a function of wavelength of light.

The TFCalc software was employed to model a layered coating to provide at least 80%, preferably 90% peak reflectivity of electromagnetic radiation at about 900 nm-1050 nm on a 2-3 mm thick sheet of standard window glass (N=1.52) when measured in air as the incident medium. A 12-layer coating with $ZrO_2$ as bottom layer on a glass substrate and a 2 nm $TiO_2$ layer disposed on the top $SiO_2$ layer was found to meet the requirements. The coating composition shown in Table 1 produced a curve showing % reflectance as a function of wavelength as shown as FIG. 2.

TABLE 1

Layer composition and thickness for the coating composition of Example 1. Layer 1 is deposited on the substrate surface.

| Layer # | Material | Thickness (nm) |
|---|---|---|
| 1 | $ZrO_2$ | 116.01 |
| 2 | $SiO_2$ | 140.77 |
| 3 | $ZrO_2$ | 102.12 |
| 4 | $SiO_2$ | 144.96 |
| 5 | $ZrO_2$ | 104.00 |
| 6 | $SiO_2$ | 169.71 |
| 7 | $ZrO_2$ | 123.76 |
| 8 | $SiO_2$ | 174.64 |
| 9 | $ZrO_2$ | 104.17 |
| 10 | $SiO_2$ | 159.86 |
| 11 | $ZrO_2$ | 91.38 |
| 12 | $SiO_2$ | 70.97 |
| 13 | $TiO_2$ | 2 |
| TOTAL | | 1504.35 |

Example 2

Figure 3:
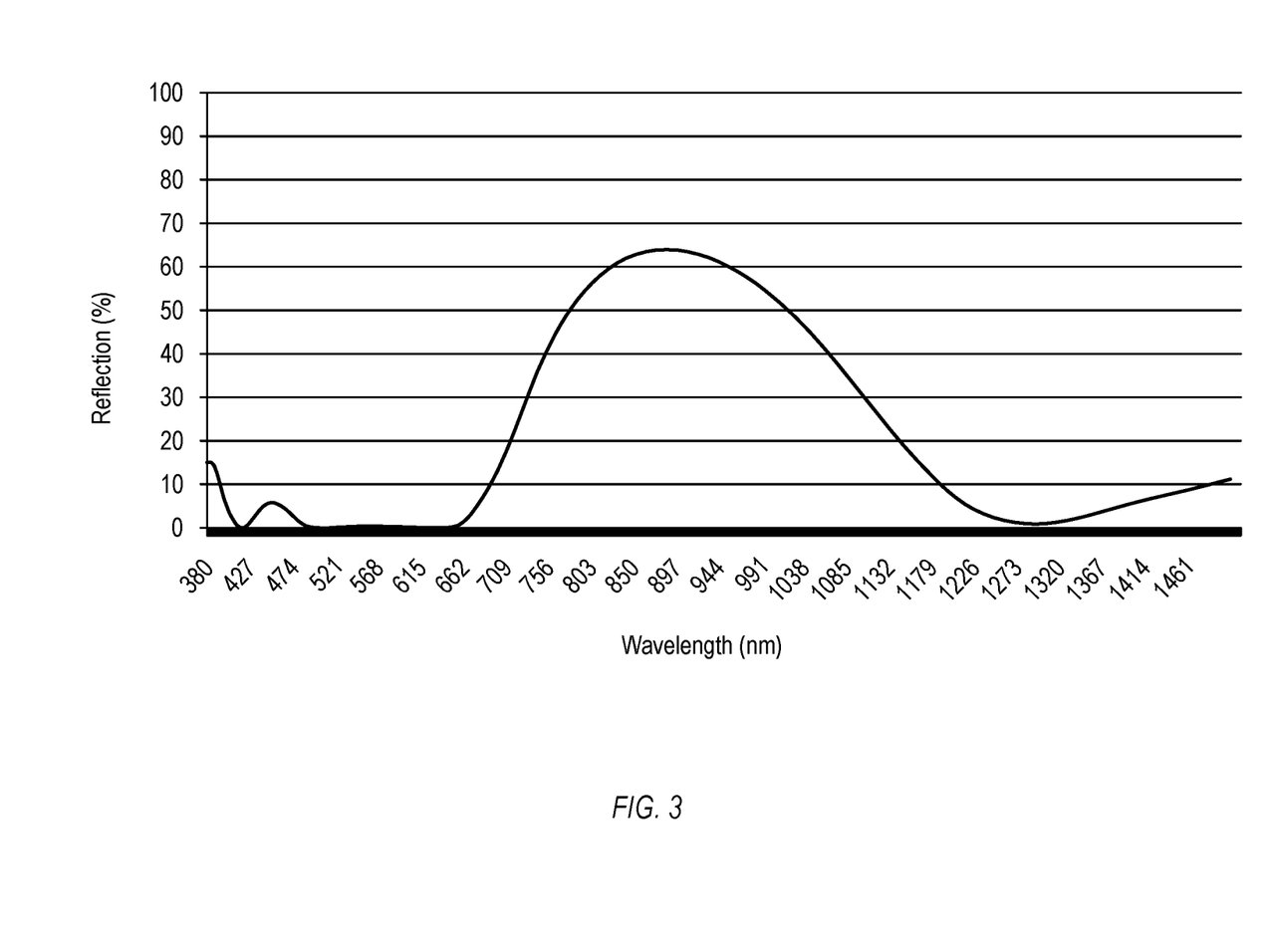
FIG. 3 is a plot of % reflection of electromagnetic radiation of another coating composition of the invention, as a function of wavelength of light.

The TFCalc software was employed to model a 6-layer coating of alternating $ZrO_2$ and $SiO_2$ layers, wherein coating thickness was optimized to provide maximum NIR reflectivity on a 2-3 mm thick sheet of standard window glass (N=1.52) when measured in air as the incident medium. The coating composition shown in Table 2 produced a curve showing % reflectance as a function of wavelength as shown as FIG. 3. The peak reflectance of 63.53% is reached at a wavelength of 876 nm, with greater than 50% reflectance at wavelengths between 777 nm to 1015 nm and less than 10% reflectance at wavelengths between 395 nm and 687 nm

TABLE 2

Layer composition and thickness for the coating composition of Example 2. Layer 1 is deposited on the substrate surface.

| Layer # | Material | Thickness (nm) |
|---|---|---|
| 1 | $ZrO_2$ | 119.43 |
| 2 | $SiO_2$ | 141.68 |
| 3 | $ZrO_2$ | 102.72 |
| 4 | $SiO_2$ | 149.77 |
| 5 | $ZrO_2$ | 88.76 |
| 6 | $SiO_2$ | 70.43 |
| 7 | $TiO_2$ | 2 |

Example 3

The TFCalc software was employed to model an 8-layer coating of alternating $ZrO_2$ and $SiO_2$ layers, wherein coating thickness was optimized to provide maximum NIR reflectivity on a 2-3 mm thick sheet of standard window glass (N=1.52) when measured in air as the incident medium. The coating composition shown in Table 3 produced a curve having peak reflectance of 79.18% at a wavelength of 850 nm, with greater than 50% reflectance at wavelengths between 735 nm to 1000 nm and less than 17% reflectance at wavelengths between 393 nm and 695 nm.

TABLE 3

Layer composition and thickness for the coating composition of Example 3. Layer 1 is deposited on the substrate surface.

| Layer # | Material | Thickness (nm) |
|---|---|---|
| 1 | $ZrO_2$ | 119.62 |
| 2 | $SiO_2$ | 138.63 |
| 3 | $ZrO_2$ | 103.5 |
| 4 | $SiO_2$ | 139.78 |
| 5 | $ZrO_2$ | 97.24 |
| 6 | $SiO_2$ | 152.74 |
| 7 | $ZrO_2$ | 86.58 |
| 8 | $SiO_2$ | 71.49 |
| 9 | $TiO_2$ | 2 |

Example 4

The TFCalc software was employed to model a 10-layer coating of alternating $ZrO_2$ and $SiO_2$ layers, wherein coating thickness was optimized to provide maximum NIR reflectivity on a 2-3 mm thick sheet of standard window glass (N=1.52) when measured in air as the incident medium. The coating composition shown in Table 4 produced a curve having peak reflectance of 88.69% at a wavelength of 837 nm, with greater than 50% reflectance at wavelengths between 720 nm to 978 nm and less than 20.4% reflectance at wavelengths between 391 nm and 696 nm.

TABLE 4

Layer composition and thickness for the coating composition of Example 4. Layer 1 is deposited on the substrate surface.

| Layer # | Material | Thickness (nm) |
|---|---|---|
| 1 | $ZrO_2$ | 119.9 |
| 2 | $SiO_2$ | 137.27 |
| 3 | $ZrO_2$ | 104.24 |
| 4 | $SiO_2$ | 135.89 |
| 5 | $ZrO_2$ | 98.39 |
| 6 | $SiO_2$ | 142.57 |
| 7 | $ZrO_2$ | 95.28 |
| 8 | $SiO_2$ | 154.24 |
| 9 | $ZrO_2$ | 86 |
| 10 | $SiO_2$ | 72.17 |
| 11 | $TiO_2$ | 2 |

Example 5

Figure 4:
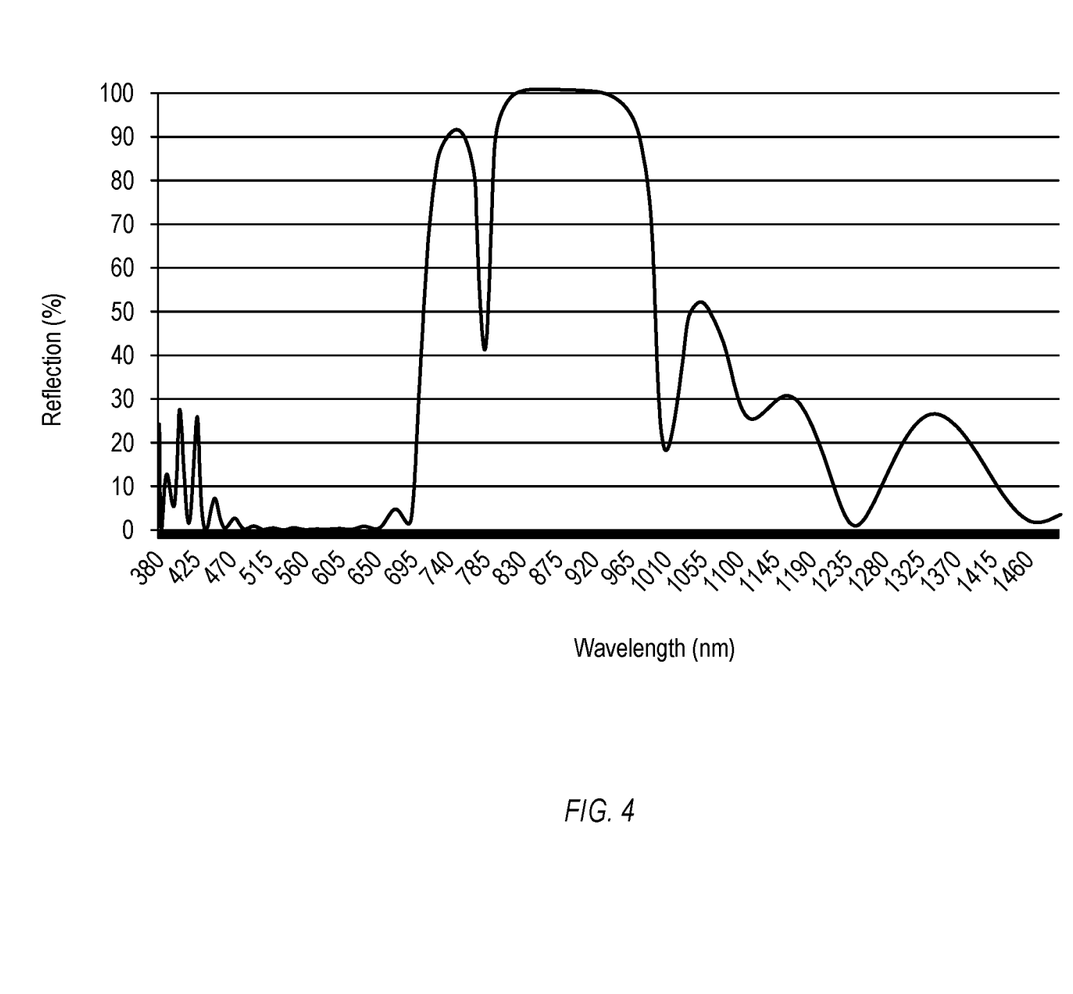
FIG. 4 is a plot of % reflection of electromagnetic radiation of another coating composition of the invention, as a function of wavelength of light.

The TFCalc software was employed to model a 20-layer coating of alternating $ZrO_2$ and $SiO_2$ layers, wherein coating thickness was optimized to provide maximum NIR reflectivity on a 2-3 mm thick sheet of standard window glass (N=1.52) when measured in air as the incident medium. The coating composition shown in Table 5 produced a curve showing % reflectance as a function of wavelength as shown as FIG. 4. The peak reflectance of 99.33% is reached at a wavelength of 874 nm, with greater than 80% reflectance at wavelengths between 725 nm to 985 nm

TABLE 5

Layer composition and thickness for the coating composition of Example 5. Layer 1 is deposited on the substrate surface.

| Layer # | Material | Thickness (nm) |
|---|---|---|
| 1 | $ZrO_2$ | 120.15 |
| 2 | $SiO_2$ | 137.91 |
| 3 | $ZrO_2$ | 105.68 |
| 4 | $SiO_2$ | 137.9 |
| 5 | $ZrO_2$ | 104.27 |
| 6 | $SiO_2$ | 151.65 |
| 7 | $ZrO_2$ | 119.52 |
| 8 | $SiO_2$ | 184.1 |
| 9 | $ZrO_2$ | 118.7 |
| 10 | $SiO_2$ | 153.24 |
| 11 | $ZrO_2$ | 101.77 |
| 12 | $SiO_2$ | 144.2 |
| 13 | $ZrO_2$ | 96.23 |
| 14 | $SiO_2$ | 144.5 |
| 15 | $ZrO_2$ | 93.92 |
| 16 | $SiO_2$ | 147.46 |
| 17 | $ZrO_2$ | 93.26 |
| 18 | $SiO_2$ | 156.57 |
| 19 | $ZrO_2$ | 84.11 |
| 20 | $SiO_2$ | 73.18 |
| 21 | $TiO_2$ | 2 |

Example 6

Figure 5:
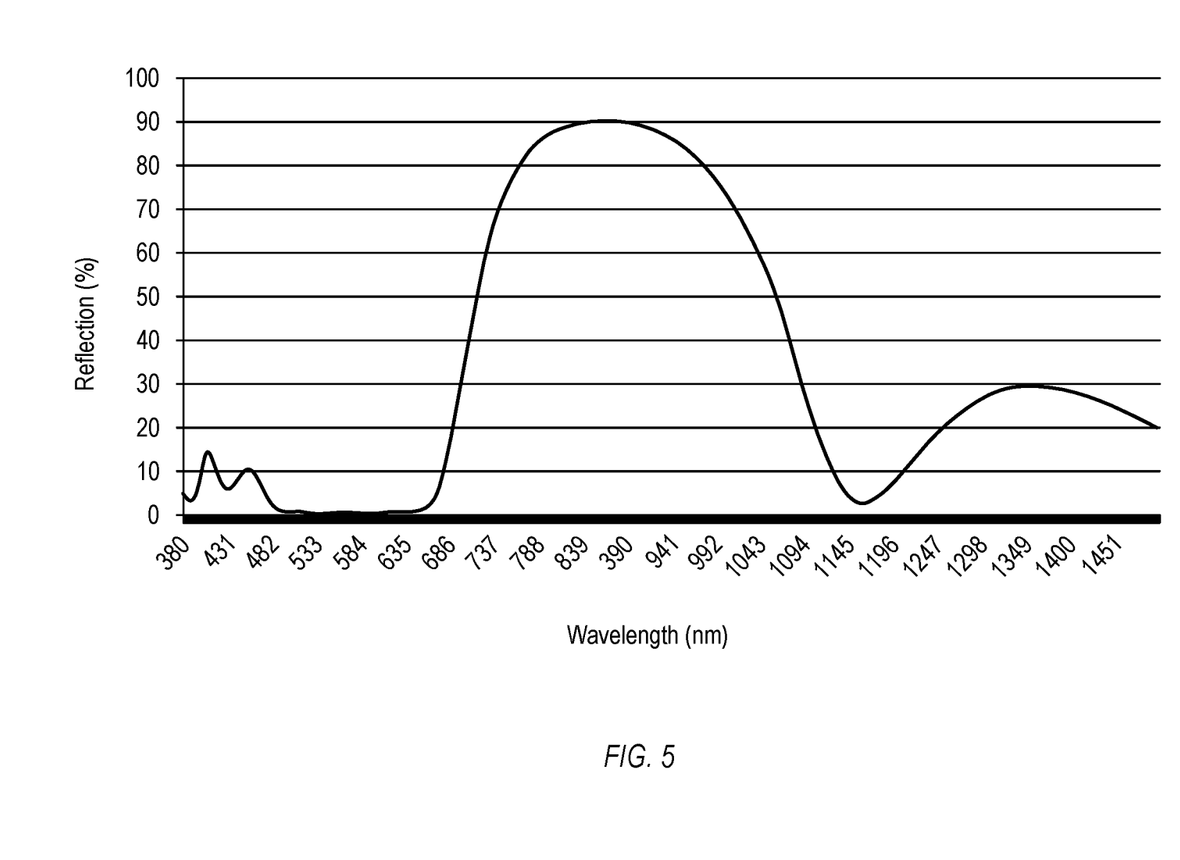
FIG. 5 is a plot of % reflection of electromagnetic radiation of another coating composition of the invention, as a function of wavelength of light.

The TFCalc software was employed to model an 8-layer coating of alternating $Nb_2O_5$ and $SiO_2$ layers, wherein coating thickness was optimized to provide maximum NIR reflectivity on a 2-3 mm thick sheet of standard window glass (N=1.52) when measured in air as the incident medium. The coating composition shown in Table 6 produced a curve showing % reflectance as a function of wavelength as shown as FIG. 5. The peak reflectance of 89.00% is reached at a wavelength of 876 nm, with greater than 50% reflectance at wavelengths between about 720 nm to about 1073 nm and less than 10% reflectance at wavelengths between about 420 nm and about 680 nm.

TABLE 6

Layer composition and thickness for the coating composition of Example 6. Layer 1 is deposited on the substrate surface.

| Layer # | Material | Thickness (nm) |
|---|---|---|
| 1 | $Nb_2O_5$ | 107.37 |
| 2 | $SiO_2$ | 141.39 |
| 3 | $Nb_2O_5$ | 93.44 |
| 4 | $SiO_2$ | 143.45 |
| 5 | $Nb_2O_5$ | 90.00 |
| 6 | $SiO_2$ | 153.67 |
| 7 | $Nb_2O_5$ | 89.23 |
| 8 | $SiO_2$ | 78.52 |
| 9 | $TiO_2$ | 2 |

Example 7

Figure 6:
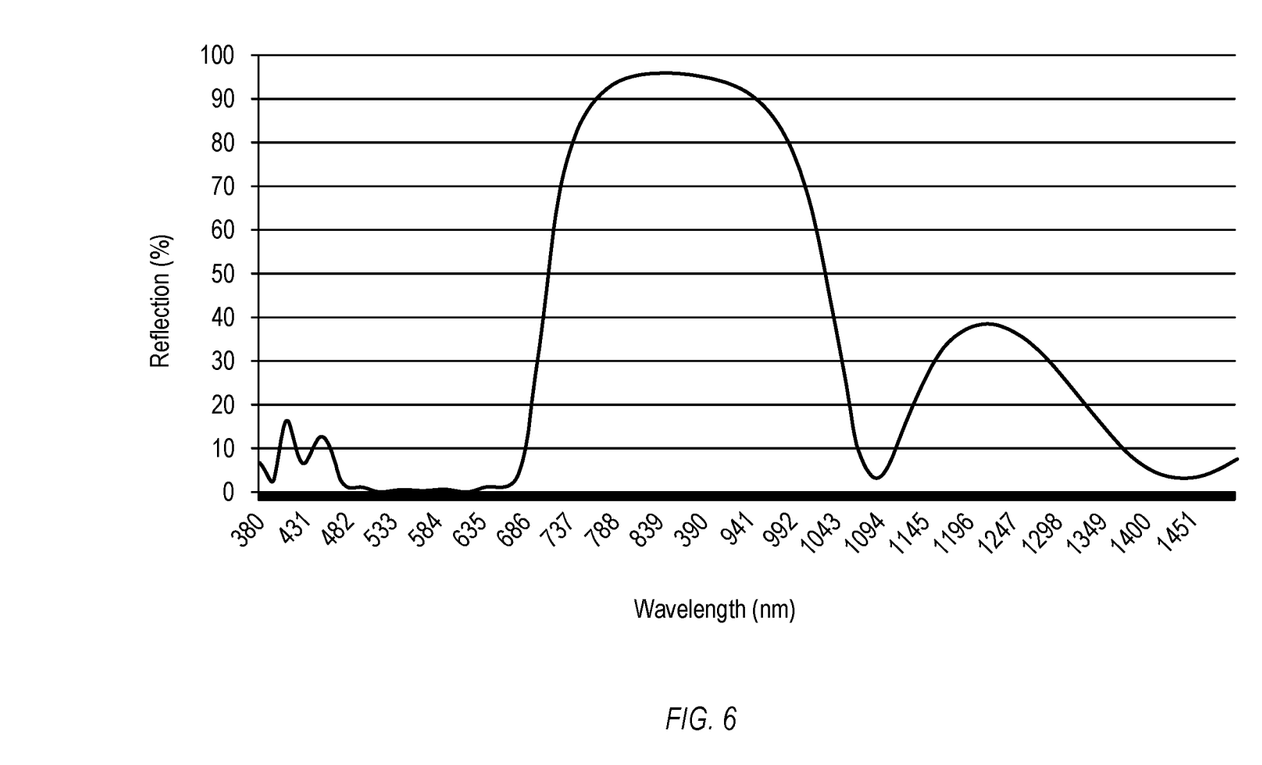
FIG. 6 is a plot of % reflection of electromagnetic radiation of another coating composition of the invention, as a function of wavelength of light.

The TFCalc software was employed to model a 10-layer coating of alternating $Nb_2O_5$ and $SiO_2$ layers, wherein coating thickness was optimized to provide maximum NIR reflectivity on a 2-3 mm thick sheet of standard window glass (N=1.52) when measured in air as the incident medium. The coating composition shown in Table 7 produced a curve showing % reflectance as a function of wavelength as shown as FIG. 6. The peak reflectance of 95.30% is reached at a wavelength of about 876 nm, with greater than 50% reflectance at wavelengths between about 710 nm to about 1040 nm, with greater than 80% reflectance at wavelengths between about 743 nm to about 980 nm, and less than 10% reflectance at wavelengths between about 420 nm and about 687 nm.

TABLE 7

Layer composition and thickness for the coating composition of Example 7. Layer 1 is deposited on the substrate surface.

| Layer # | Material | Thickness (nm) |
|---|---|---|
| 1 | $Nb_2O_5$ | 107.41 |
| 2 | $SiO_2$ | 140.37 |
| 3 | $Nb_2O_5$ | 93.47 |
| 4 | $SiO_2$ | 140.64 |
| 5 | $Nb_2O_5$ | 89.35 |
| 6 | $SiO_2$ | 146.22 |
| 7 | $Nb_2O_5$ | 89.09 |
| 8 | $SiO_2$ | 154.72 |
| 9 | $Nb_2O_5$ | 89.50 |
| 10 | $SiO_2$ | 78.86 |
| 11 | $TiO_2$ | 2 |

Comparative Examples 1-4

Comparative examples, also generated using computer modeling using the TFCalc software, show that alternating layers of $SiO_2$ and $TiO_2$ do not accomplish NIR-reflectivity. In U.S. Pat. No. 5,332,618: Antireflection Layer System With Integral UV Blocking Properties, four specific examples are given for coating designs that provide UV blocking properties. These are listed in Table 8, with coating thickness of the layers calculated from the optical thickness disclosed in the '618 patent, further as deposited on a 2-3 mm thick sheet of standard window glass (N=1.52) when measured in air as the incident medium.

TABLE 8

Layer composition and thickness for coatings disclosed in U.S. Pat. No. 5,332,618 deposited on a glass surface. Layer 1 is deposited on the glass surface.

| Layer | Material | Optical Thickness, $\lambda_0$ = 330 nm | Layer Thickness, nm |
|---|---|---|---|
| Comparative Coating 1 | | | |
| 1 | $SiO_2$ | $0.395859*\lambda_0$ | 88.6 |
| 2 | $TiO_2$ | $1.088748*\lambda_0$ | 140.9 |
| 3 | $SiO_2$ | $0.173525*\lambda_0$ | 38.84 |
| 4 | $TiO_2$ | $0.242913*\lambda_0$ | 31.44 |
| 5 | $SiO_2$ | $0.250000*\lambda_0$ | 55.95 |
| 6 | $TiO_2$ | $0.225679*\lambda_0$ | 29.21 |
| 7 | $SiO_2$ | $0.250000*\lambda_0$ | 55.95 |
| 8 | $TiO_2$ | $0.103993*\lambda_0$ | 13.46 |
| Comparative Coating 2 | | | |
| 1 | $SiO_2$ | $0.458737*\lambda_0$ | 102.67 |
| 2 | $TiO_2$ | $0.336784*\lambda_0$ | 43.58 |
| 3 | $SiO_2$ | $0.157281*\lambda_0$ | 35.2 |
| 4 | $TiO_2$ | $0.315573*\lambda_0$ | 40.84 |
| 5 | $SiO_2$ | $0.250000*\lambda_0$ | 55.95 |
| 6 | $TiO_2$ | $0.238724*\lambda_0$ | 30.89 |
| 7 | $SiO_2$ | $0.250000*\lambda_0$ | 55.95 |
| 8 | $TiO_2$ | $0.136298*\lambda_0$ | 17.61 |
| Comparative Coating 3 | | | |
| 1 | $SiO_2$ | $0.458737*\lambda_0$ | 105.87 |
| 2 | $TiO_2$ | $0.336784*\lambda_0$ | 44.9 |
| 3 | $SiO_2$ | $0.157281*\lambda_0$ | 36.3 |
| 4 | $TiO_2$ | $0.315573*\lambda_0$ | 42.08 |
| 5 | $SiO_2$ | $0.250000*\lambda_0$ | 57.7 |
| 6 | $TiO_2$ | $0.238724*\lambda_0$ | 31.83 |
| 7 | $SiO_2$ | $0.250000*\lambda_0$ | 57.7 |
| 8 | $TiO_2$ | $0.136298*\lambda_0$ | 18.17 |
| Comparative Coating 4 | | | |
| 1 | $SiO_2$ | $0.500471*\lambda_0$ | 122.56 |
| 2 | $TiO_2$ | $0.219616*\lambda_0$ | 29.28 |
| 3 | $SiO_2$ | $0.213652*\lambda_0$ | 52.32 |
| 4 | $TiO_2$ | $0.253475*\lambda_0$ | 33.8 |
| 5 | $SiO_2$ | $0.250000*\lambda_0$ | 61.22 |
| 6 | $TiO_2$ | $0.210004*\lambda_0$ | 28 |
| 7 | $SiO_2$ | $0.250000*\lambda_0$ | 61.22 |
| 8 | $TiO_2$ | $0.113690*\lambda_0$ | 15.16 |

Figure 7:
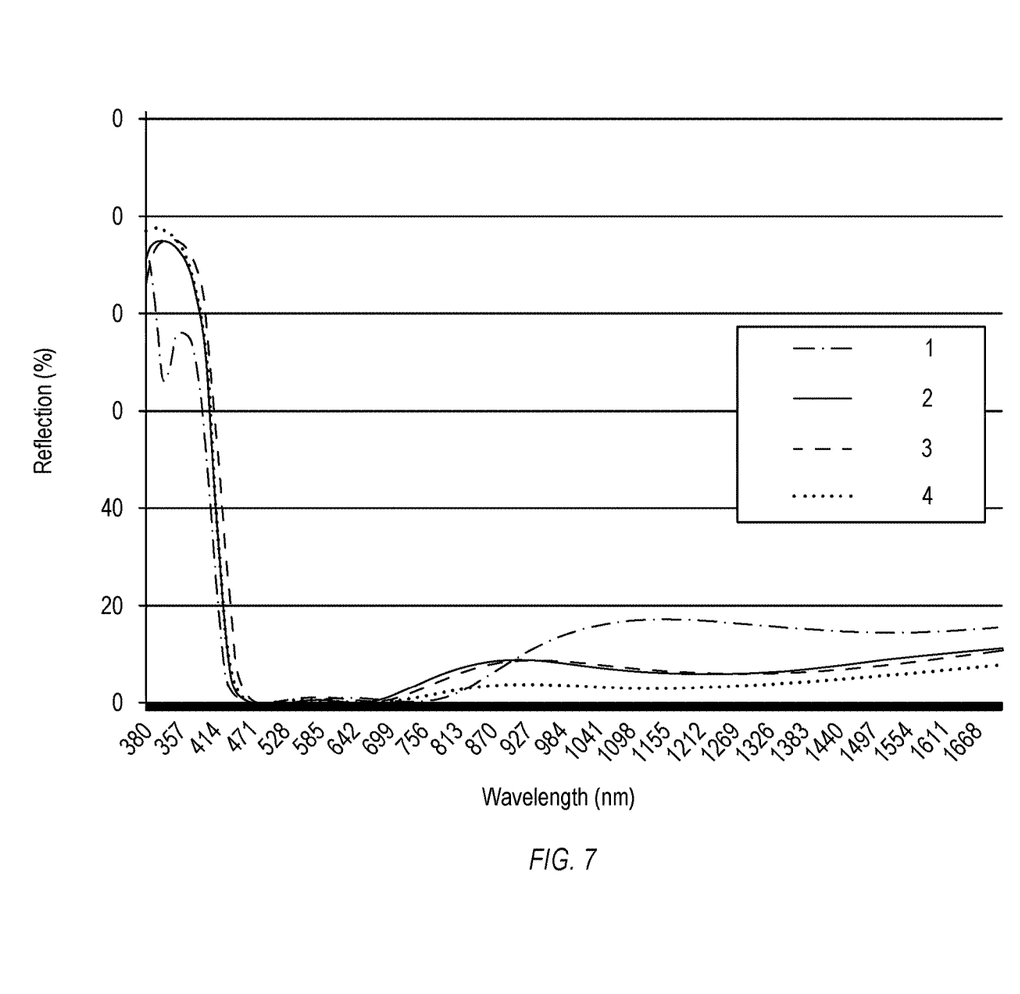
FIG. 7 is a plot of % reflection of electromagnetic radiation of comparative coating compositions, as a function of wavelength of light.

Modeling of these Comparative Coating examples for % reflectance of wavelengths higher than about 800 nm revealed that the Comparative Coatings 1-4 provide peak reflection in the NIR range of about 10-18%. The model results are shown in FIG. 7.

The invention illustratively disclosed herein can be suitably practiced in the absence of any element which is not specifically disclosed herein. Additionally each and every embodiment of the invention, as described herein, is intended to be used either alone or in combination with any other embodiment described herein as well as modifications, equivalents, and alternatives thereof. In various embodiments, the invention suitably comprises, consists essentially of, or consists of the elements described herein and claimed according to the claims. It will be recognized that various modifications and changes may be made without following the example embodiments and applications illustrated and described herein, and without departing from the scope of the claims.

The invention claimed is:

1. A near infrared reflective coating composition comprising 6 to 20 alternating layers of $SiO_2$ and one of $ZrO_2$ or $Nb_2O_5$, and a layer of $TiO_2$ disposed on a top layer of the alternating layers, wherein a thickness of each individual layer of $SiO_2$ and one of $ZrO_2$ or $Nb_2O_5$ is about 70 nm to 200 nm, wherein a bottom layer of the alternating layers includes the one of $ZrO_2$ or $Nb_2O_5$ and contacts a first major surface of a transparent substrate, and wherein the $TiO_2$ layer is about 0.5 nm to 5 nm thick.

2. The near infrared reflective coating composition of claim 1 wherein a top layer and the bottom layer of the alternating layers are different from each other in terms of composition, thickness, or both.

3. A coated article having a near infrared reflective coating, the coated article comprising a substantially planar and transparent substrate comprising a coating disposed on at least a first major surface thereof, the coating comprising 6 to 20 alternating layers of $SiO_2$ and one of $ZrO_2$ or $Nb_2O_5$ and a layer of $TiO_2$ disposed on a top layer of the alternating layers, wherein a thickness of each individual layer of $SiO_2$ and one of $ZrO_2$ or $Nb_2O_5$ is about 70 nm to 200 nm, and wherein the $TiO_2$ layer is about 0.5 nm to 5 nm thick, and wherein a bottom layer of the alternating layers includes the one of $ZrO_2$ or $Nb_2O_5$ and contacts the first major surface.

4. The coated article of claim 3 wherein the substantially planar and transparent substrate is glass.

5. The coated article of claim 4 wherein the glass is tempered window glass.

6. The coated article of claim 3 wherein the substantially planar and transparent substrate is about 1 mm to 10 mm thick and optionally comprises one or more substrate layers.

7. The coated article of claim 3 wherein the bottom layer and a top layer of the alternating layers of the coating are different from each other in terms of composition, thickness, or both.

8. The coated article of claim 3 wherein the bottom layer is thicker than a topmost layer of the one of $ZrO_2$ or $Nb_2O_5$.

9. The coated article of claim 3 wherein an additional coating is disposed on a second major surface of the substrate.

10. The coated article of claim 9 wherein the additional coating is a UV reflective coating.

11. A method of making a coated substrate having a near infrared reflective coating, the method comprising:
providing a substantially planar and transparent substrate having a first major surface;
depositing a coating composition on the first major surface, the coating composition comprising 6 to 20 alternating layers of $SiO_2$ and one of $ZrO_2$ or $Nb_2O_5$ beginning with a first layer of the one of $ZrO_2$ or $Nb_2O_5$, wherein a thickness of each individual layer is about 70 nm to 200 nm; and
depositing a $TiO_2$ layer after depositing the alternating layers of $SiO_2$ and one of $ZrO_2$ or $Nb_2O_5$, wherein a thickness of the $TiO_2$ layer is about 0.5 nm to 5 nm.

12. The method of claim 11 wherein depositing a coating composition on the first major surface includes depositing the alternating layers by magnetron sputtering.

13. The method of claim 12 wherein the magnetron sputtering of each $SiO_2$ layer is carried out using a $SiO_x$ target.

14. The method of claim 12 wherein the magnetron sputtering of each $ZrO_2$ layer or each $Nb_2O_5$ layer is carried out using one of a $ZrO_x$ target or an $Nb_2O_x$ target.

15. The method of claim 11 wherein the first layer is thicker than a topmost layer of the one of $ZrO_2$ or $Nb_2O_5$.

* * * * *

UNITED STATES PATENT AND TRADEMARK OFFICE
CERTIFICATE OF CORRECTION

PATENT NO. : 10,816,703 B2
APPLICATION NO. : 15/278611
DATED : October 27, 2020
INVENTOR(S) : James C. DeCoux Page 1 of 1

It is certified that error appears in the above-identified patent and that said Letters Patent is hereby corrected as shown below:

In the Claims

Column 17, Claim 3, Line 19 after "70 nm to 200 nm," delete ""and""

Signed and Sealed this
Nineteenth Day of January, 2021

Andrei Iancu
*Director of the United States Patent and Trademark Office*